(12) United States Patent
Hashizume et al.

(10) Patent No.: US 11,747,417 B2
(45) Date of Patent: Sep. 5, 2023

(54) MAGNETIC RESONANCE IMAGING SYSTEM AND POWER CONTROL METHOD

(71) Applicant: Canon Medical Systems Corporation, Otawara (JP)

(72) Inventors: Yohei Hashizume, Tokyo (JP); Tomoyuki Yoshida, Nasushiobara (JP); Kazuto Nakabayashi, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/451,684

(22) Filed: Oct. 21, 2021

(65) Prior Publication Data

US 2022/0146609 A1    May 12, 2022

(30) Foreign Application Priority Data

Nov. 9, 2020   (JP) ................. 2020-186623

(51) Int. Cl.
  *G01R 33/3815*  (2006.01)
  *H02J 9/06*  (2006.01)
  *H01F 6/04*  (2006.01)
  *G01R 33/38*  (2006.01)

(52) U.S. Cl.
  CPC ..... *G01R 33/3815* (2013.01); *G01R 33/3804* (2013.01); *H01F 6/04* (2013.01); *H02J 9/06* (2013.01)

(58) Field of Classification Search
  CPC .............. G01R 33/3815; G01R 33/3804; G01R 33/36; H01F 6/04; H02J 9/06; H02J 2310/52
  See application file for complete search history.

(56) References Cited

FOREIGN PATENT DOCUMENTS

| CN | 106532920 A | * | 3/2017 | |
|---|---|---|---|---|
| DE | 202016006654 U1 | * | 1/2017 | ........... G01R 33/288 |
| JP | 2001-103679 A | | 4/2001 | |
| JP | 2005-018710 A | | 1/2005 | |
| JP | 5886014 B2 | | 3/2016 | |

(Continued)

OTHER PUBLICATIONS

A. Prudenzi, A. Fioravanti, L. Petriconi and V. Caracciolo, "Power Quality problems in hospital: a case study," 2019 IEEE Milan PowerTech, 2019, pp. 1-6 (Year: 2019).*

(Continued)

*Primary Examiner* — Daniel R Miller
(74) *Attorney, Agent, or Firm* — Oblon, McClelland, Maier & Neustadt, L.L.P.

(57) ABSTRACT

According to one embodiment, a magnetic resonance imaging system includes a first power supply, one or more second power supplies and control circuitry. The first power supply supplies power to a magnetic resonance imaging apparatus at a time of power outage of a commercial power supply electrically connected to the magnetic resonance imaging apparatus. The second power supplies supply the power to the magnetic resonance imaging apparatus. The control circuitry determines a state of feeding from the first power supply and the second power supplies to the magnetic resonance imaging apparatus, and performs control of power consumption in the magnetic resonance imaging apparatus based on a determination result of the state of feeding.

9 Claims, 10 Drawing Sheets

(56) References Cited

FOREIGN PATENT DOCUMENTS

| | | |
|---|---|---|
| JP | 2022-76270 A | 5/2022 |
| JP | 2022-76271 A | 5/2022 |

OTHER PUBLICATIONS

T. Kiehn, Selecting the Right Uninterruptible Power Supply to Protect Diagnostic Equipment, 2016 (Year: 2016).*
Healthcare report—Powering healthcare, Eaton, 2019 (Year: 2019).*

* cited by examiner

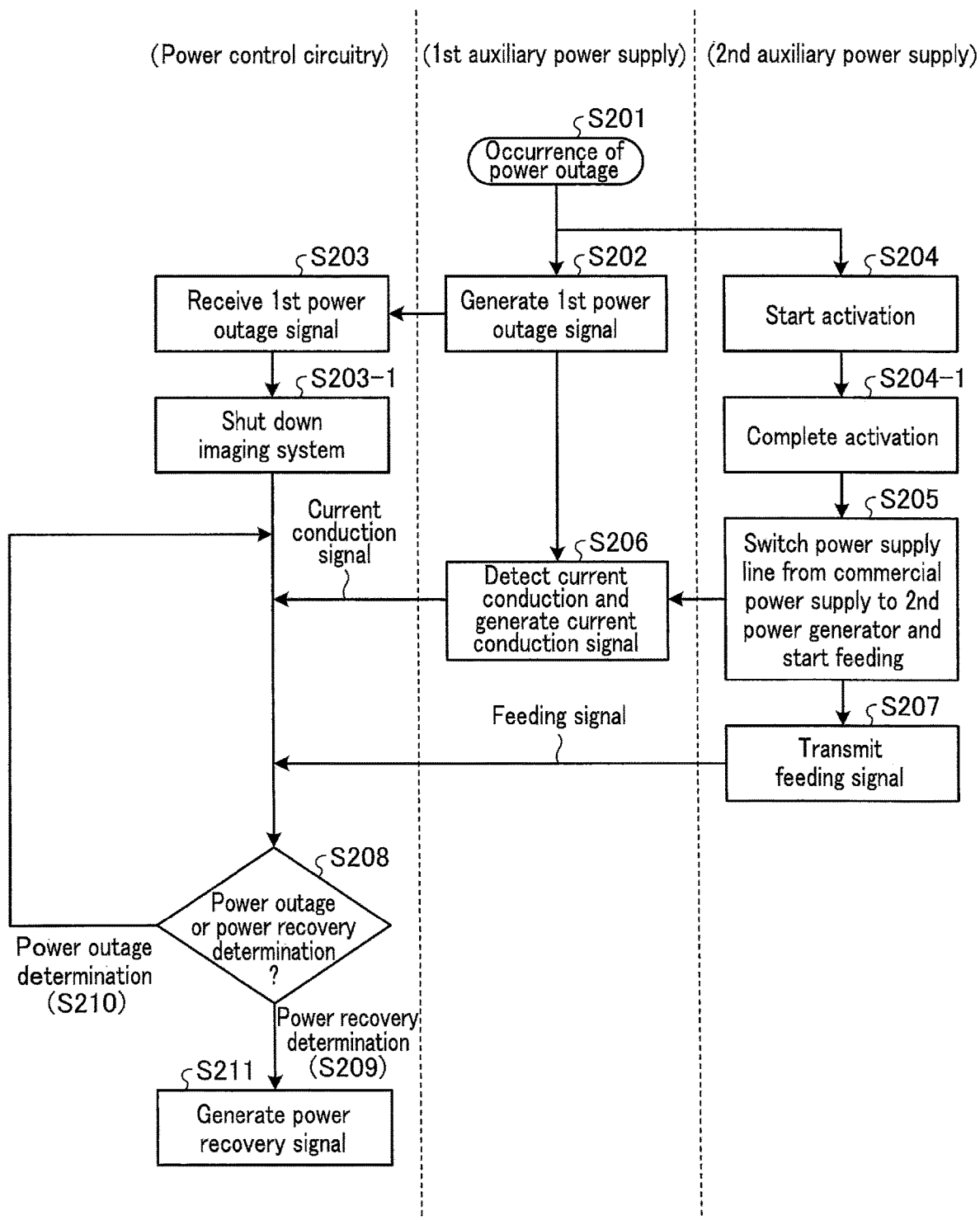
F I G. 4

| Output from 1st auxiliary power supply \ (Via switch board) Presence or absence of feeding signal from 2nd auxiliary power supply | Feeding signal: 0 (Absence of feeding signal) | Feeding signal: 1 (Presence of feeding signal) |
|---|---|---|
| 1st power outage signal: 0 Absence of power supply from primary side (input side) | (0,0) Commercial power supply: power outage 2nd auxiliary power supply activating UPS: Power supply Power outage determination | |
| Current conduction signal: 1 Presence of power supply from primary side (input side) | (1,0) Commercial power supply: non-power outage UPS: Charge Power recovery determination or expiration of power warranty period of 2nd auxiliary power supply | (1,1) Commercial power supply: power outage UPS: Charge Power outage determination |

FIG. 6

MAGNETIC RESONANCE IMAGING SYSTEM AND POWER CONTROL METHOD

CROSS-REFERENCE TO RELATED APPLICATIONS

This application is based upon and claims the benefit of priority from Japanese Patent Application No. 2020-186623, filed Nov. 9, 2020, the entire contents of which are incorporated herein by reference.

FIELD

Embodiments described herein relate generally to a magnetic resonance imaging system and a power control method.

BACKGROUND

In recent years, the possibility has increased that large-scale blackouts may occur due to a natural disaster, such as heavy typhoon. Once large-scale blackouts occur, the power outage period may continue for one week or longer. In this case, there is a high possibility of quenching occurring in a magnetic resonance imaging apparatus (hereinafter referred to as an MRI apparatus) using a superconducting magnet. As a measure against an occurrence of quenching, the power supply of the MRI apparatus may be compensated for by an emergency power supply, such as a power generator. For example, it is known that an uninterruptible power supply (hereinafter referred to as a UPS) is used as a configuration that feeds power to a minimum necessary unit in the MRI apparatus upon receipt of a contact signal from the UPS when the power outage occurs, and completes processing of imaged data in the order of higher degree of urgency. Furthermore, to compensate for a short power compensation time by the UPS, using a power generator of a longer power compensation time on a stage subsequent to the UPS is also known.

While power compensation by the UPS is being performed after power outage has occurred, if power supply from the power generator on the subsequent stage to the MRI apparatus is performed via the UPS, the UPS will transmit an erroneous contact signal, indicating that the commercial power supply has recovered, to the system of the MRI apparatus. At this time, upon receipt of the contact signal from the UPS, the MRI apparatus switches from the feed to the minimum necessary unit to the feed to the overall MRI apparatus. This will result in a problem wherein the power compensation time by the power generator will be considerably shorter than the preset period of time.

BRIEF DESCRIPTION OF THE DRAWINGS

FIG. 4 is a diagram showing an example of a sequence related to power supply processing according to the embodiment.

FIG. 6 is a table showing determination results by a determination function in relation to a state of feeding to an MRI apparatus in the power supply processing according to the embodiment.

DETAILED DESCRIPTION

In general, according to one embodiment, a magnetic resonance imaging system includes a first auxiliary power supply, one or more second auxiliary power supplies and control circuitry. The first auxiliary power supply is configured to supply power to a magnetic resonance imaging apparatus at a time of power outage of a commercial power supply electrically connected to the magnetic resonance imaging apparatus. The one or more second auxiliary power supplies are configured to supply the power to the magnetic resonance imaging apparatus, the one or more second auxiliary power supplies being electrically connected in series to the first auxiliary power supply. The control circuitry is configured to determine a state of feeding from the first auxiliary power supply and the one or more second auxiliary power supplies to the magnetic resonance imaging apparatus. The control circuitry is configured to perform control of power consumption in the magnetic resonance imaging apparatus based on a determination result of the state of feeding.

Hereinafter, an embodiment of a magnetic resonance imaging system and a power control method will be explained in detail with reference to the accompanying drawings. In the embodiments described below, elements assigned with the same reference symbols are assumed to perform the same operations, and redundant descriptions thereof will be omitted as appropriate.

EMBODIMENT

Figure 1:
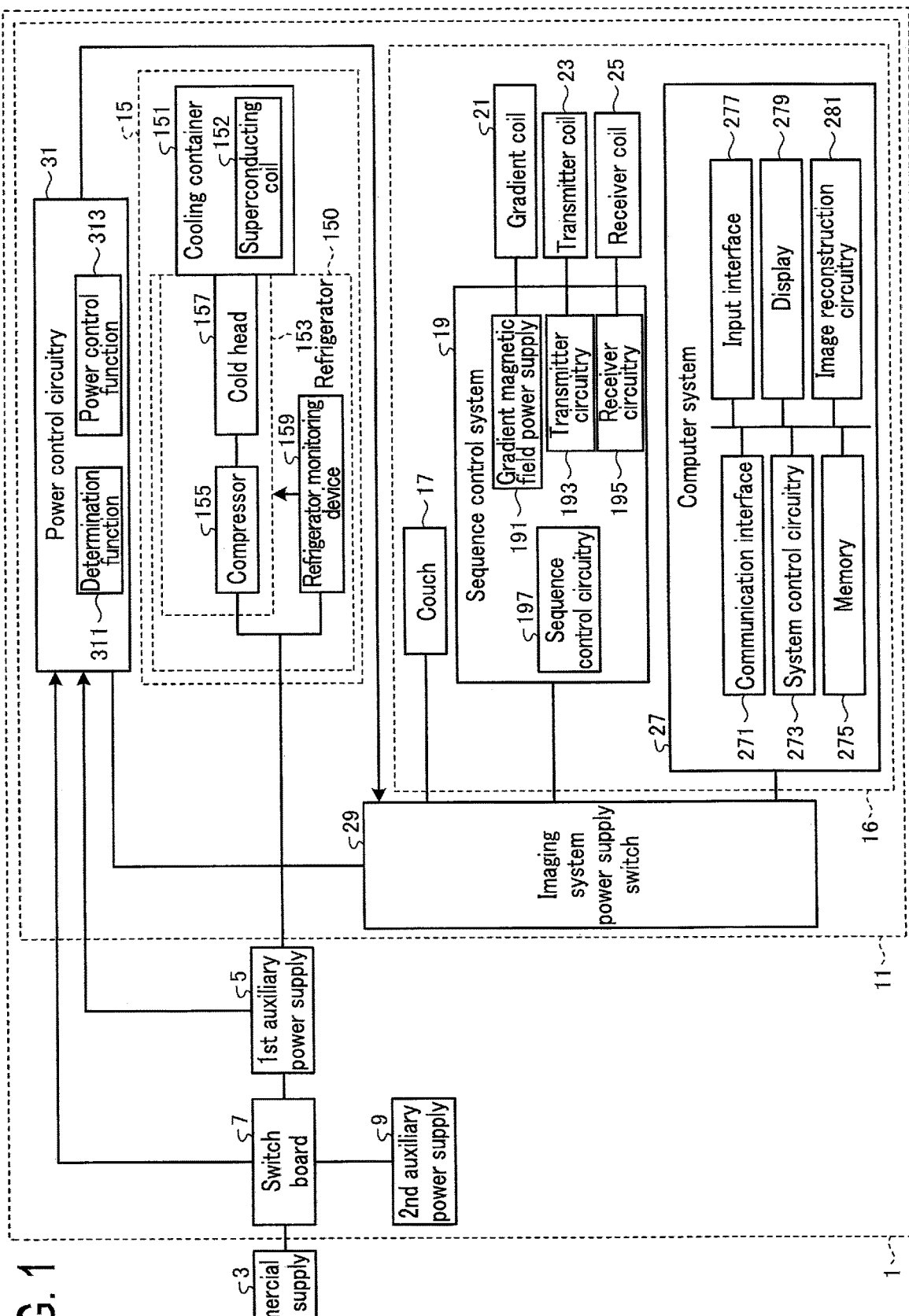
FIG. 1 is a block diagram showing an example of a magnetic resonance imaging system according to an embodiment.

FIG. 1 is a block diagram showing an example of a magnetic resonance imaging (hereinafter referred to as an MRI) system 1. A commercial power supply 3 corresponds to a facility power supply in a hospital or the like where the MRI system 1 is placed. The MRI system 1 is electrically connected to the commercial power supply 3. The commercial power supply 3 is a power supply provided from the facility, such as a hospital, where the MRI apparatus 11 is placed. The voltage supplied from the commercial power supply 3 is appropriately selected from a range of, for example, 100 V to 480 V. The commercial power supply 3 supplies power to the MRI apparatus 11 via a switch board 7 and a first auxiliary power supply 5. At this time, the power supplied from the commercial power supply 3 is supplied to all units in the MRI apparatus 11; for example, a magnetostatic field generation unit 15, a couch 17, a sequence control system 19, a computer system 27, power control circuitry 31, etc.

The MRI system 1 includes the first auxiliary power supply 5, the switch board 7, a second auxiliary power supply 9, and the MRI apparatus 11. The first auxiliary power supply 5 is realized by, for example, an uninterruptible power supply (hereinafter referred to as the UPS) or a power generator. The UPS is preferable as the first auxiliary power supply 5; therefore, in the following description, the first auxiliary power supply 5 is assumed to be the UPS.

The first auxiliary power supply (UPS) 5 supplies power to the MRI apparatus 11, in case of power outage of the commercial power supply 3 electrically connected to the MRI apparatus 11. Furthermore, in case of power outage of the commercial power supply 3, the UPS 5 is electrically connected to and power-fed by the commercial power supply 3. Specifically, as shown in FIG. 1, a power input side (hereinafter referred to as the primary side) of the UPS 5 is electrically connected to the commercial power supply 3 via the switch board 7. A power output side (hereinafter referred to as the secondary side) of the UPS 5 is electrically connected to at least a cooling portion 150. In other words, as shown in FIG. 1, the secondary side of the UPS 5 is electrically connected to the power control circuitry 31 in addition to the cooling portion 150.

Specifically, the UPS 5 includes, for example, a storage battery and a current conduction detector. The storage battery is realized by, for example, a lead battery or a lithium-ion battery. The storage battery supplies power to the MRI apparatus 11, for example, in case of power outage of the commercial power supply 3. In case of non-power-outage of the commercial power supply 3, the storage battery is charged by power supplied from the commercial power supply 3. Power capacity of the storage battery in the UPS 5 is appropriately selected depending on the amount of power consumption of a target to be compensated, for example, the cooling portion 150 or the power control circuitry 31. The UPS 5 detects whether power outage of the commercial power supply 3 has occurred through the current conduction detector.

For example, the current conduction detector is realized by a relay (hereinafter referred to as a current conduction relay) that operates if current conduction occurs on the power input side (the primary side) of the UPS 5. The current conduction detector detects whether current conduction occurs on the primary side of the UPS 5 by the relay. Current non-conduction on the primary side of the UPS 5 corresponds to power outage of the commercial power supply 3. The current conduction detector outputs a first power outage signal indicative of power outage of the commercial power supply 3 to the power control circuitry 31 upon detection of the power outage of the commercial power supply 3. The first power outage signal may be output to the second auxiliary power supply 9 via the switch board 7. The first power outage signal is a contact signal that is generated by the current conduction relay and that, for example, causes the power supplied from the commercial power supply 3 to be OFF (0). The first power outage signal may be realized by digital data indicating "0".

The current conduction detector detects current conduction on the primary side of the UPS 5 by the current conduction relay. The current conduction on the primary side of the UPS 5 corresponds to current conduction from the commercial power supply 3 or the second auxiliary power supply 9. The current conduction detector outputs a current conduction signal indicative of the current conduction on the primary side to the power control circuitry 31 (determination portion) upon detection of the power conduction. The current conduction signal is a contact signal that is generated by the current conduction relay and that, for example, causes the power supplied from the commercial power supply 3 to be ON (1). The current conduction signal may be realized by digital data indicating 1. Through the above process, the UPS 5 outputs the first power outage signal or the current conduction signal to the power control circuitry 31.

The switch board 7 is provided in a middle portion of an electrical path between the commercial power supply 3 and the MRI apparatus 11. The switch board 7 switches a power supply source of the first auxiliary power supply 5 between the commercial power supply 3 and the second auxiliary power supply 9. Specifically, at a timing when a predetermined time has elapsed since the occurrence of power outage of the commercial power supply 3, the switch board 7 switches the power supply source of the MRI apparatus 11 from the commercial power supply 3 to the second auxiliary power supply 9. The switch board 7 includes, for example, a power outage detector that detects whether power outage of the commercial power supply 3 has occurred, a timer that measures a predetermined time elapsed since the occurrence of the power outage of the commercial power supply 3, and a switch that performs the switching (hereinafter referred to as the power supply switch). The switch board 7 outputs a feeding signal output from the second auxiliary power supply 9 to the power control circuitry 31.

The power outage detector detects whether power outage of the commercial power supply 3 has occurred by means of a relay (hereinafter referred to as a power outage detection relay) provided on, for example, the primary side of the switch board 7 connected to the commercial power supply 3. The power outage detector outputs a second power outage signal indicative of power outage of the commercial power supply 3 to the second auxiliary power supply 9 upon detection of the power outage of the commercial power supply 3. The second power outage signal is a contact signal that is generated by the power outage detection relay and that, for example, causes the power supplied from the commercial power supply 3 to be OFF (0). The second power outage signal may be realized by digital data indicating 0. The power outage detector outputs a power recovery signal indicative of power recovery of the commercial power supply 3 to the second auxiliary power supply 9 upon detection of the power recovery of the commercial power supply 3. The power recovery signal may be output to the power supply switch. The power recovery signal is a contact signal that is generated by the power outage detection relay and that, for example, causes the power supplied from the commercial power supply 3 to be ON (1). The power recovery signal may be realized by digital data indicating 1.

The timer counts a predetermined time upon receipt of the second power outage signal output from the power outage detector. In a case where the second auxiliary power supply 9 is a power generator, the predetermined time is a period that is required to stabilize the power generated by the power generator. The predetermined time is set in advance to be, for example, 1 minute. When the predetermined time has elapsed since the occurrence of the power outage of the commercial power supply 3, the timer outputs a control signal for controlling the power supply switch (hereinafter referred to as a power supply switch signal) to the power supply switch.

The power supply switch switches a power supply line to the MRI apparatus 11 between the commercial power supply 3 and the second auxiliary power supply 9. For example, the power supply switch switches the power supply source from the commercial power supply 3 to the second auxiliary power supply 9 upon receipt of the power supply switch signal. Furthermore, the power supply switch switches the power supply source from the second auxiliary power supply 9 to the commercial power supply 3 upon receipt of a completion signal indicative of a completion of a shutdown operation of the second auxiliary power supply 9 to be described later. The power supply switch may switch the power supply source from the second auxiliary power supply 9 to the commercial power supply 3 upon receipt of the power recovery signal.

An output side (secondary side) of the second auxiliary power supply 9 is electrically connected to the first auxiliary power supply 5 via the switch board 7. That is, the second auxiliary power supply 9 is electrically connected to the first auxiliary power supply 5 in series. The second auxiliary power supply 9 is realized by, for example, at least one of a plurality of UPSs or a plurality of power generators. The second auxiliary power supply 9 is preferably an auxiliary power supply that is capable of power compensation over a long period of time, for example, one hour or longer. To make the description more specific, the description hereinafter will be given on the assumption that the second auxiliary power supply 9 is a power generator. In a case where the UPS is used as the second auxiliary power supply 9, the primary side of the second auxiliary power supply 9 is connected to the commercial power supply 3 and receives power supply from the commercial power supply 3. Power capacity of the second auxiliary power supply 9 is appropriately selected depending on the amount of power consumption of a target to be compensated, for example, the cooling portion 150 or the power control circuitry 31.

The power generator that realizes the second auxiliary power supply 9 includes a motor that generates, for example, a three-phase alternating current, and a feed detector that detects the generated three-phase alternating current as feed to the switch board 7. The motor starts driving upon receipt of the second power outage signal output from the switch board 7. The motor generates a three-phase alternating current by the driving. Accordingly, the power generator 9 starts generation of power. Furthermore, the power generator 9 performs a shutdown operation of the motor upon receipt of the power recovery signal output from the switch board 7. When the shutdown operation of the motor is completed, the power generator 9 outputs the completion signal to the switch board 7.

The feed detector detects whether there is power feed from the second auxiliary power supply 9 to the switch board 7 by a relay (hereinafter referred to as a feed relay) provided on an output side of the power generator 9 (namely, the secondary side of the power generator 9). The feed detector outputs a feeding signal indicative of power feed by the second auxiliary power supply 9 to the power control circuitry 31 (determination portion) via the switch board 7 upon detection of the power feed by the second auxiliary power supply 9. The feeding signal is a contact signal that is generated by the feed relay and that, for example, causes the power supplied from the second auxiliary power supply 9 to be ON (1). The feeding signal may be realized by digital data indicating 1. The feed detector stops transmission of the feeding signal to the power control circuitry 31 upon stoppage of the power feed by the second auxiliary power supply 9, namely, upon completion of the shutdown operation of the motor.

The MRI apparatus 11 includes the magnetostatic field generation unit 15 that generates a magnetostatic field, an imaging system 16 related to imaging of a subject using the magnetostatic field, a switch (hereinafter referred to as an imaging system power supply switch) 29 that switches between ON and OFF of power supply to the imaging system 16, and the power control circuitry 31 that controls the imaging system power supply switch 29. The MRI apparatus 11 is electrically connected to the commercial power supply 3 or the second auxiliary power supply 9, as the power supply source, via the first auxiliary power supply 5 and the switch board 7. The power supplied from outside of the MRI apparatus 11 is distributed to the imaging system power supply switch 29, the power control circuitry 31, and the cooling portion 150 via a system transformer. The imaging system 16 includes the couch 17, the sequence control system 19, a gradient coil 21, a transmitter coil 23, a receiver coil 25, and the computer system 27.

The magnetostatic field generation unit 15 includes the cooling portion 150, and a cooling container 151 that contains a superconducting coil 152 related to generation of a magnetostatic field. The cooling portion 150 cools the superconducting coil 152 that generates a magnetostatic field. Specifically, the cooling portion 150 includes a refrigerator 153 that cools a refrigerant for cooling the superconducting coil 152 to a cryogenic temperature, a refrigerator monitoring device 159, and a heat exchanger related to cooling of the refrigerator 153. The refrigerant is, for example, helium gas.

The magnetostatic field generation unit 15 includes a superconducting coil 152 formed in a hollow substantially cylindrical shape, and generates a magnetostatic field inside the hollow part. The magnetostatic field generated in the magnetostatic field generation unit 15 is generated by a superconducting magnet. The superconducting magnet is realized by supplying a current to the superconducting coil 152 in the cooling container 151 in a superconducting state.

The cooling container 151 is formed in a substantially cylindrical shape and stored in a cylindrical wall of a vacuum case (not shown). As a common example, the cooling container 151 contains liquid helium and the superconducting coil 152 within the cylindrical wall to maintain the inside of the container to a sufficiently low-temperature state. In the cooling container 151, liquid helium and helium gas that is evaporated from the liquid helium are held in equilibrium.

Inside the cooling container 151, a heater (not shown) is provided. The heater heats and evaporates the liquid helium inside the cooling container 151 to adjust the pressure in the cooling container 151. The purpose of adjusting the pressure is, for example, to prevent unintended flow of air into the cooling container 151. If the helium gas in the cooling container 151 is excessively cooled, the proportion of the liquid helium in the cooling container 151 increases, resulting in reduction of the pressure in the cooling container 151. If the pressure in the cooling container 151 is reduced to a negative pressure, the air flows into the cooling container 151. The heater is controlled by the refrigerator monitoring device 159 to heat the helium in the cooling container 151, so that the pressure in the cooling container 151 falls within a preset range.

The refrigerator 153 cools the refrigerant contained in the cooling container 151. The refrigerator 153 includes a compressor 155 and a cold head 157, and a supply pipe, an exhaust pipe, a vent valve, an intake valve, a buffer tank, etc., which are not shown in the drawings. The refrigerator 153 includes a water-cooling device that cools the refrigerant with water or an air-cooling device that cools the refrigerant with air. The water-cooling device and the air-cooling device correspond to the heat exchanger. The water-cooling device continuously cools the refrigerant in the refrigerator 153 with water. The water-cooling device is also referred to as a chiller corresponding to a cold-water supply device, which exchanges heat with external air. Since a conventional air-cooling device and chiller may be used as the air-cooling device and chiller of this embodiment, explanations thereof will be omitted.

The compressor 155 compresses the refrigerant gas, such as helium gas, by a motor or the like, and supplies the compressed refrigerant gas to the cold head 157 via the supply pipe. The motor is, for example, of an inverter-driven type. The compressor 155 recovers expanded refrigerant gas inside the cold head 157 via the exhaust pipe. The compressor 155 is connected to the buffer tank filled with the refrigerant gas via the vent valve and the intake valve. The buffer tank is filled with the refrigerant gas. The compressor 155 exhausts the refrigerant gas to the buffer tank via the vent valve. The compressor 155 intakes the refrigerant gas within the buffer tank via the intake valve.

The cold head 157 expands the compressed refrigerant gas supplied via the supply pipe, and cools the refrigerant in the cooling container 151. Thus, the cold head 157 cools the refrigerant to a temperature equal to or lower than the boiling point of the refrigerant. When the cooling container 151 is cooled to a certain degree or more, the helium gas in the cooling container 151 is re-condensed to be liquid helium. FIG. 1 shows an example in which the cooling container 151 is provided with one cold head 157; however, the number of cold heads 157 is not limited to one but may be two or more.

The vent valve and the intake valve are provided in a pipe connecting the compressor 155 and the buffer tank. The vent valve causes the refrigerant gas in the compressor 155 to be exhausted to the buffer tank in accordance with instructions from the refrigerator monitoring device 159. Exhaust of the refrigerant gas from the compressor 155 reduces the pressure of the refrigerant gas supplied from the compressor 155 to the cold head 157. The intake valve causes the refrigerant gas in the buffer tank to be supplied to the compressor 155 in accordance with instructions from the refrigerator monitoring device 159. Supply of the refrigerant gas to the compressor 155 increases the pressure of the refrigerant gas supplied from the compressor 155 to the cold head 157.

The refrigerator monitoring device 159 monitors the refrigerant in the refrigerator 153 and the cooling container 151. For example, the refrigerator monitoring device 159 monitors the pressure in the cooling container 151, and controls the heater so that the pressure in the cooling container 151 falls within a preset range. The refrigerator monitoring device 159 monitors the pressure of the refrigerant gas supplied from the compressor 155 to the cold head 157, and controls the vent valve and the intake valve so that the pressure falls within a preset range.

The couch 17 includes a couch top on which the subject is placed. The couch 17 is composed of an actuator including various motors for driving the couch top and the couch 17, a drive force transmission unit that transmits the drive force generated by the actuator to movable parts, etc. The couch 17 and the couch top are moved in longitudinal directions of the couch top and vertical directions under the control of system control circuitry 273 in the computer system 27. For example, the couch top moves to an imaging space with the subject placed thereon.

The sequence control system 19 includes a gradient magnetic field power supply 191 to generate a gradient field for identification of a position, transmitter circuitry 193, receiver circuitry 195, and sequence control circuitry 197.

The gradient magnetic field power supply 191 supplies a current to the gradient coil 21 under the control of the sequence control circuitry 197 by the power supplied via the system transformer and the imaging system power supply switch 29.

The transmitter circuitry 193 transmits a radio frequency (RF) pulse corresponding to a Larmor frequency to the transmitter coil 23 under the control of the sequence control circuitry 197. The transmitter circuitry 193 includes, for example, an oscillator, a phase selector, a frequency converter, an amplitude modulator, an RF amplifier, etc. The oscillator generates an RF pulse of a resonance frequency specific to a target nucleus in the magnetostatic field. The phase selector selects a phase of the RF pulse generated by the oscillator. The frequency converter converts a frequency of the RF pulse output from the phase selector. The amplitude modulator modulates an amplitude of the RF pulse output from the frequency converter, in accordance with a sinc function, for example. The RF amplifier amplifies the RF pulse output from the amplitude modulator with the power supplied via the system transformer and the imaging system power supply switch 29, and supplies the amplified pulse to the transmitter coil 23.

The receiver circuitry 195 analog-to-digital (AD) converts an analog MR signal output from the receiver coil 25 and generates MR data. The receiver circuitry 195 transmits the generated MR data to the sequence control circuitry 197.

The sequence control circuitry 197 drives the gradient magnetic field power supply 191, the transmitter circuitry 193, and the receiver circuitry 195, based on sequence information transmitted from the computer system 27, thereby imaging the subject. The sequence information is information that defines procedures to perform imaging. The sequence control circuitry 197 images the subject by driving the gradient magnetic field power supply 191, the transmitter circuitry 193, and the receiver circuitry 195. As a result, upon receipt of the MR data from the receiver circuitry 195, the sequence control circuitry 197 transfers the received MR data to the computer system 27. The sequence control circuitry 197 is realized by, for example, a processor. Various functions to be executed by the sequence control circuitry 197 are stored in a memory 275 in the form of programs. The sequence control circuitry 197 reads out each program from the memory 275 and executes it to realize the function corresponding to the program. In other words, the sequence control circuitry 197 which has read out each program has the function corresponding to the program.

In the descriptions above, an example has been described in which the processor reads out a program corresponding to each function from the memory 275 and executes it. However, the embodiment is not limited to this example. The term "processor" used in the above description refers to, for example, circuitry such as a CPU, a graphics processing unit (GPU), an application specific integrated circuit (ASIC), a programmable logic device (such as a simple programmable logic device (SPLD), a complex programmable logic device (CPLD), a field programmable gate array (FPGA)), etc.

If the processor is a CPU, the processor realizes its function by reading and executing the program stored in the memory 275. On the other hand, if the processor is an ASIC, the function corresponding to a program is directly incorporated in a circuit of the processor as a logic circuit, instead of being stored in the storage circuitry. The processors described in connection with the above embodiment are not limited to single-circuit processors; a plurality of independent circuits may be integrated into a single processor that realizes the functions. Although an example has been described in which the single storage circuitry stores a program corresponding to each processing function, a plurality of storage circuitries may be placed in a distributed manner and the processor may be configured to read the corresponding program from each storage circuitry.

The gradient coil 21 is a hollow substantially cylindrical coil, and is disposed on an inner surface of the cylindrical cooling container 151. The gradient coil 21 generates a gradient field in which the magnetic field strength changes along X, Y, and Z axes orthogonal to each other.

The transmitter coil 23 is disposed inside the gradient coil 21, and irradiates the subject placed in the imaging space with a high-frequency pulse transmitted from the transmitter circuitry 193. In other words, the transmitter coil 23 receives an RF pulse from the transmitter circuitry 193, and generates a high-frequency magnetic field in the imaging space in the MRI apparatus 11.

The receiver coil 25 can be located in accordance with an imaging target site of the subject to be imaged. The receiver coil 25 receives an MR signal generated from the subject due to excitation of a hydrogen nucleus with the high-frequency pulse radiated from the transmitter coil 23. The transmitter coil 23 may receive the MR signal in place of the receiver coil 25. The receiver coil 25 outputs the received MR signal to the receiver circuitry 195.

The computer system 27 performs overall control of the MRI apparatus 11, generation of an MR image, etc. The computer system 27 includes, for example, a communication interface 271, the system control circuitry 273, the memory 275, an input interface 277, a display 279, image reconstruction circuitry 281, etc.

The communication interface 271 performs various communications with the couch 17 and the sequence control system 19. The communication interface 271 performs communications with medical picture archiving and communication systems (PACS), radiology information systems (RIS), etc. via a network (not shown).

The system control circuitry 273 performs overall control of the MRI apparatus 11, for example, controls each portion of the MRI apparatus 11. The system control circuitry 273 performs imaging related to generation of an MR image. For example, the system control circuitry 273 performs generation of sequence information, acquisition of MR data, etc. Specifically, the system control circuitry 273 creates a sequence condition based on an imaging condition input by an operator via the input interface 277. Next, the system control circuitry 273 transmits the sequence condition to the sequence control system 19 via the communication interface 271. The system control circuitry 273 is realized by, for example, a processor. Since the technical idea of the processor is similar to that described above, explanations thereof will be omitted.

The memory 275 stores the MR data received by the communication interface 271, k-space data located in k-space by the image reconstruction circuitry 281, image data generated by the image reconstruction circuitry 281, etc. The memory 275 is realized by, for example, a semiconductor memory device such as a random access memory (RAM) or a flash memory, or a hard disk, an optical disk, etc.

The input interface 277 receives various types of instructions (for example, a power-on instruction) and information input from the operator. The input interface 277 is realized by a trackball, a switch button, a mouse, a keyboard, a touch pad with which an input operation can be performed by touching its operation screen, a touch screen in which a display screen and a touch pad are integrated, non-contact input circuitry using an optical sensor, sound input circuitry, etc.

The input interface 277 is connected to the system control circuitry 273 and adapted to convert input operations received from the operator into electric signals and to output the electric signals to the system control circuitry 273. In the present specification, the input interface 277 is not limited to physical operating components such as a mouse and a keyboard. For example, the input interface 277 also includes electrical signal processing circuitry that receives an electrical signal corresponding to an input operation through an external input device separate from the computer system 27, and outputs the electrical signal to the system control circuitry 273.

The display 279 displays MR images or the like generated by various graphical user interfaces (GUIs) or the image reconstruction circuitry 281 under the control of the system control circuitry 273. The display 279 is, for example, a display device such as liquid crystal display.

The image reconstruction circuitry 281 reconstructs MR images related to the subject based on the MR data received from the sequence control system 19 via the communication interface 271. For example, the image reconstruction circuitry 281 generates k-space data based on the MR data, performs image reconstruction processing for the k-space data by two or three-dimensional Fourier transform, and generates MR images. The image reconstruction circuitry 281 stores the generated MR images in, for example, the memory 275. The image reconstruction circuitry 281 is realized by, for example, a processor. Since the technical idea of the processor is similar to that described above, explanations thereof will be omitted.

ON/OFF operations of the imaging system power supply switch 29 are controlled by the power control circuitry 31. For example, the imaging system power supply switch 29 is realized by a relay having normally closed contacts (a mechanical relay or the like). If no current is output from the power control circuitry 31, a movable contact in the imaging system power supply switch 29 is biased to a fixed contact by an elastic body or the like to bring a closed state. If a current output from the power control circuitry 31 is supplied to a contact driving coil in the relay, the contact driving coil generates a magnetic field. Due to the generation of the magnetic field, the contacts of the imaging system power supply switch 29 are opened. When the imaging system power supply switch 29 is opened, if the supply of a current from the power control circuitry 31 is cut off, the magnetic field generated by the contact driving coil CC is extinguished, so that the imaging system power supply switch 29 is brought to the closed state.

The power control circuitry 31 performs control of power consumption in the MRI apparatus 11 based on a determination result of a state of feeding from the first auxiliary power supply 5 and the second auxiliary power supply 9 to the MRI apparatus 11. The power control circuitry 31 includes a determination function 311 and a power control function 313. The power control circuitry 31 that realizes the determination function 311 is an example of the determination portion. The power control circuitry 31 that realizes the power control function 313 is an example of the power control portion. Various functions, such as the determination function 311 and the power control function 313, are stored in the storage circuitry in the power control circuitry 31 in a form of a program executable by a computer. The power control circuitry 31 is realized by, for example, a processor as processing circuitry. For example, the power control circuitry 31 reads out each program from the storage circuitry and executes it to realize the function corresponding to the program. In other words, the power control circuitry 31 which has read each program has the respective functions of the determination function 311 and the power control function 313. Since the technical idea of the processor is similar to that described above, explanations thereof will be omitted.

The power control circuitry 31 determines a state of feeding from the first auxiliary power supply 5 and the second auxiliary power supply 9 to the MRI apparatus 11 through the determination function 311. For example, the determination function 311 determines whether power outage of the commercial power supply 3 has occurred based on the first power outage signal or the current conduction signal, and a presence or absence of the feeding signal. The determination of the state of feeding will be described later in explanations of a process of controlling power supply (hereinafter referred to as power supply processing) in the MRI apparatus 11 based on the state of feeding.

The power control circuitry 31 performs control of power consumption in the MRI apparatus 11 by the power control function 313 based on the determination result of the state of feeding. Specifically, when the power outage of the commercial power supply 3 is determined by the determination function 311 (hereinafter referred to as power outage determination), the power control function 313 supplies power from the first auxiliary power supply 5 or the second auxiliary power supply 9 to the cooling portion 150 and the power control circuitry 31 (the determination portion and the power control portion). In other words, the power control function 313 controls the imaging system power supply switch 29 based on the power outage determination, so that power is supplied from the UPS 5 or the power generator 9 to the cooling portion 150 and the power control circuitry 31.

More specifically, the power control function 313 supplies a current to the contact driving coil in the imaging system power supply switch 29 over a period when the power outage determination continues, and opens the imaging system power supply switch 29. The power control function 313 may output to the imaging system power supply switch 29 an optical signal for use in opening the imaging system power supply switch 29 (for example, digital data corresponding to "1") in place of the electrical contact signal. Accordingly, at a time of power outage of the commercial power supply 3, the first auxiliary power supply (UPS) 5 and the second auxiliary power supply 9 are electrically connected to the power control circuitry 31 and the cooling portion 150. Thus, if the first power outage signal is received and if the determination function 311 determines that power outage has occurred, the power control function 313 supplies power to the cooling portion 150 and the power control circuitry 31 (the determination portion and the power control portion).

If the MRI apparatus 11 is not provided with the imaging system power supply switch 29, the power control function 313 turns off power of components (the couch 17, the sequence control system 19, and the computer system 27) included in the imaging system 16, upon receipt of the first power outage signal.

Furthermore, the power control circuitry 31 controls the imaging system power supply switch 29 by the power control function 313 when the commercial power supply 3 recovers, so that the power can be supplied to the overall MRI apparatus 11. Specifically, when the power recovery of the commercial power supply 3 is determined by the determination function 311 (hereinafter referred to as power recovery determination), the power control function 313 supplies power from the commercial power supply 3 to all units in the MRI apparatus 11.

More specifically, based on stoppage of the current conduction signal output from the UPS 5 and the feeding signal from the power generator 9, the power control function 313 stops supplying a current to the imaging system power supply switch 29. The power control function 313 may output to the imaging system power supply switch 29 an optical signal for use in closing the imaging system power supply switch 29 (for example, digital data corresponding to "0") in place of the electrical contact signal. Accordingly, the imaging system power supply switch 29 is closed, and the power is supplied to the overall MRI apparatus 11. Details of the various processings by the power control function 313 will be described in the section of power supply processing below.

Figure 2:
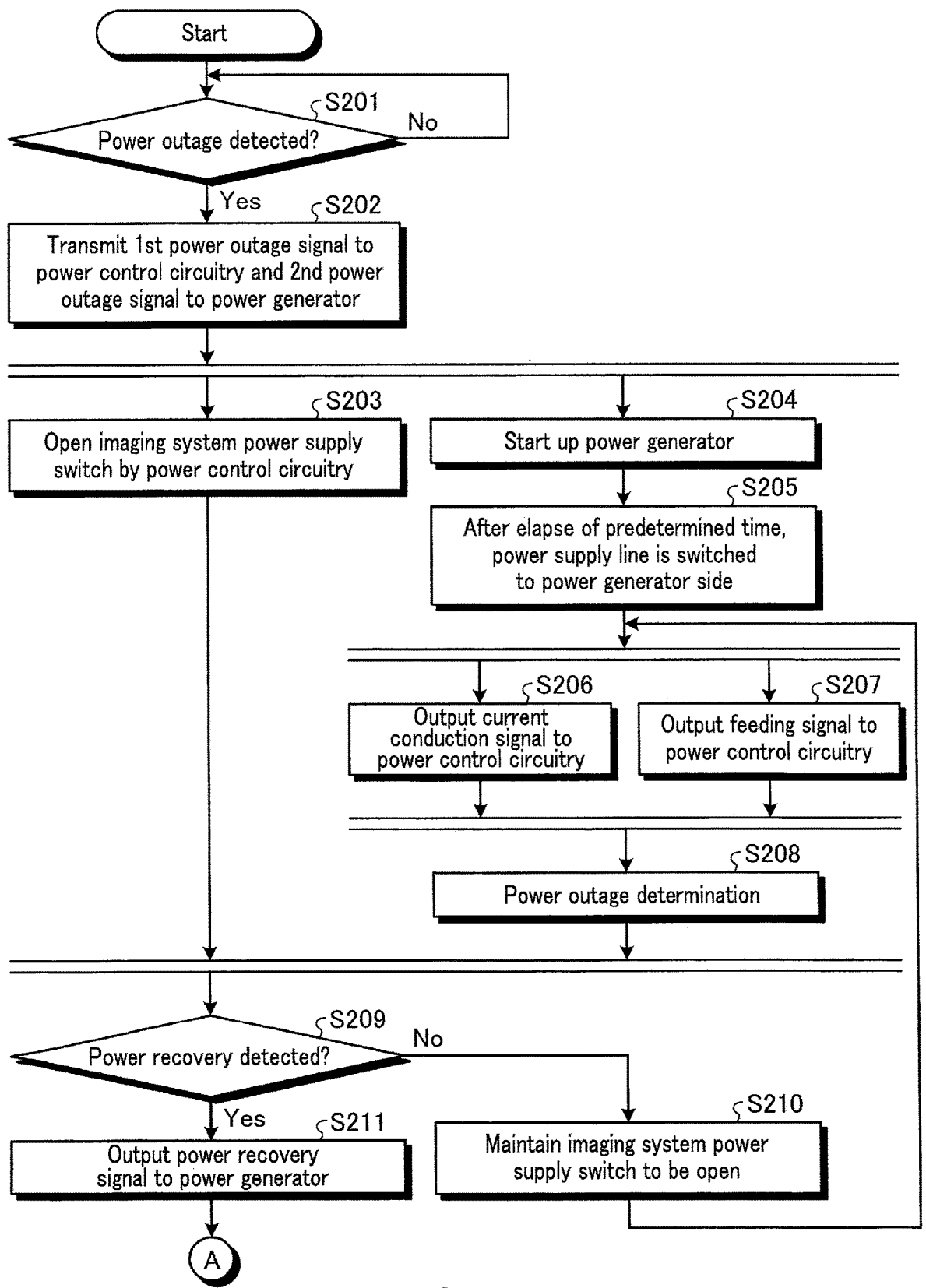
FIG. 2 is a flowchart showing an example of a procedure of power supply processing according to the embodiment.
Figure 3:
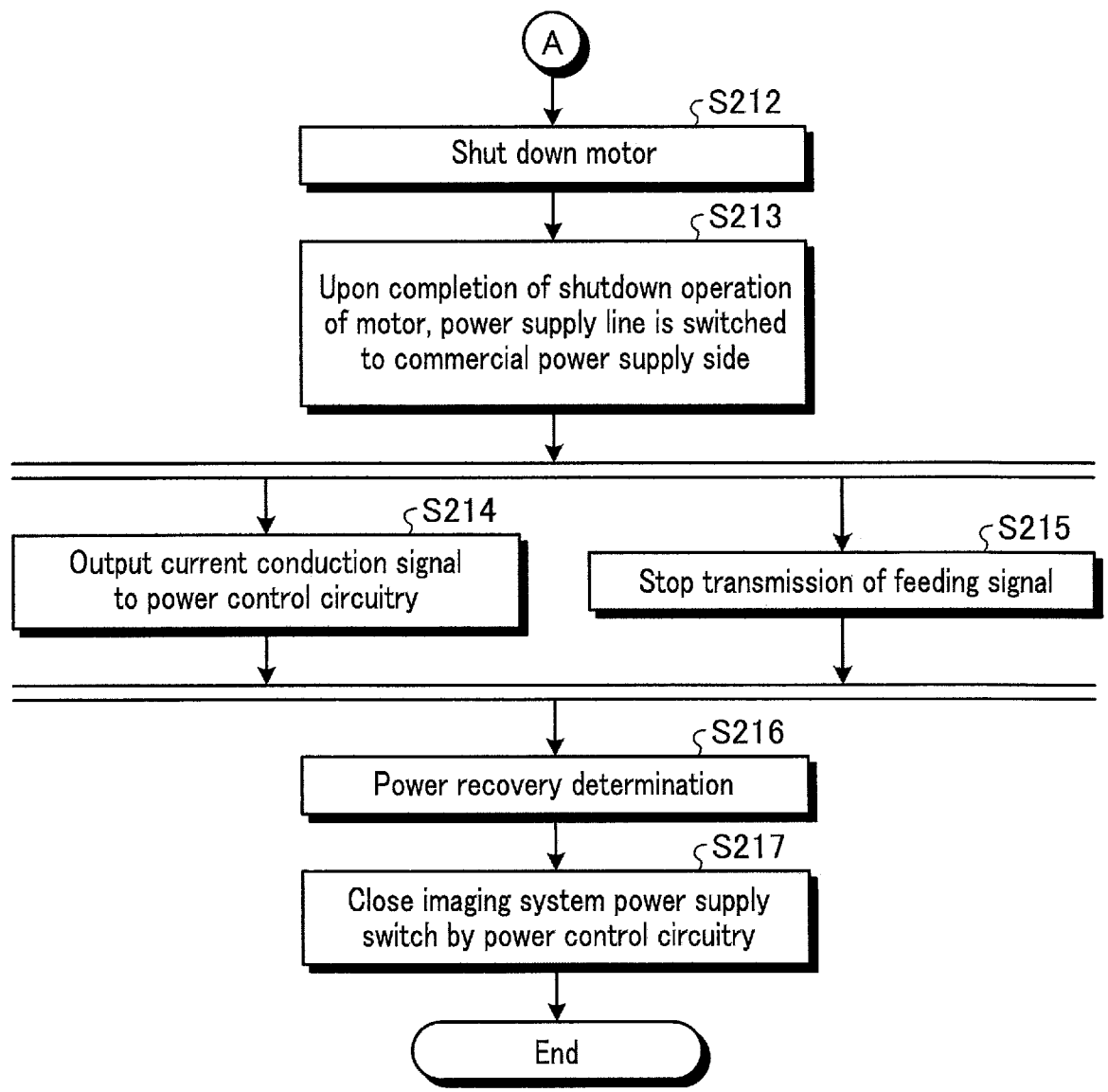
FIG. 3 is a flowchart showing an example of a procedure of power supply processing according to the embodiment.
Figure 5:
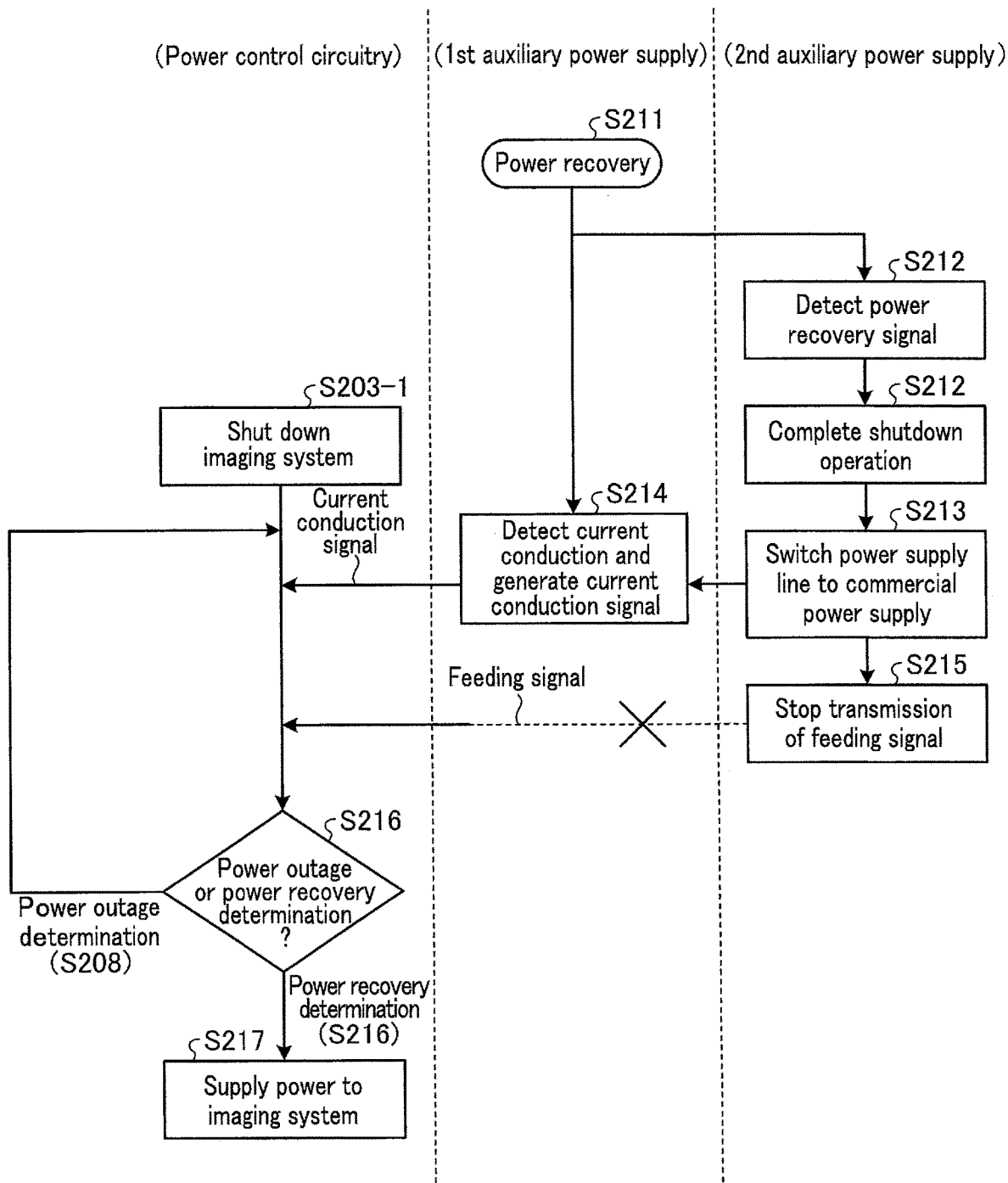
FIG. 5 is a diagram showing an example of a sequence related to power supply processing according to the embodiment.

The power supply processing performed by the MRI system 1 of the embodiment configured as above will be explained with reference to FIG. 2 to FIG. 5. FIGS. 2 and 3 are flowcharts showing an example of a procedure of the power supply processing. FIGS. 4 and 5 are diagrams showing an example of a sequence related to the power supply processing. It is assumed that the commercial power supply 3 is in a non-power-outage state before the process expressed by the flowcharts and the sequences. At this time, the switch board 7 electrically connects the commercial power supply 3 and the MRI apparatus 11 as a power supply line.

It is also assumed that a current is not supplied from the power control circuitry 31 to the imaging system power supply switch 29, and that the movable contact in the imaging system power supply switch 29 is biased to the fixed contact by an elastic body. In other words, it is assumed that the imaging system power supply switch 29 has normally closed contacts, namely, that the switch is in a closed state. For example, after the MRI system 1 is set, the process expressed by the flowcharts is always executed once a current supply to the MRI apparatus 11 starts.

(Power Supply Processing)

(Step S201)

If power outage in the commercial power supply 3 is not detected (No in step S201), this step is repeated. If power outage in the commercial power supply 3 is detected (Yes in step S201), the process in step S202 is executed. Specifically, when power outage has occurred in the commercial power supply 3, the current conduction detector in the UPS 5 and the power outage detector in the switch board 7 detect the power outage in the commercial power supply 3. Upon detection of the power outage of the commercial power supply 3, the power supply processing is started.

(Step S202)

The current conduction detector in the UPS 5 generates a first power outage signal. The UPS 5 transmits the generated first power outage signal to the power control circuitry 31 as an electrical signal. The power outage detector in the switch board 7 generates a second power outage signal. The first power outage signal may be converted to an optical signal (for example, digital data corresponding to "0") before being input to the MRI apparatus 11, and the converted optical signal may be transmitted to the power control circuitry 31 via, for example, an optical cable. The switch board 7 transmits the generated second power outage signal to the power generator 9. Upon generation of the second power outage signal, the timer starts counting a predetermined time.

(Step S203)

The power control circuitry 31 receives the first power outage signal output from the UPS 5. Then, upon receipt of the first power outage signal, the power control circuitry 31 outputs a signal to open the imaging system power supply switch 29 to the imaging system power supply switch 29 by the power control function 313. Upon receipt of the signal, the imaging system power supply switch 29 is opened (Step S203-1 in FIG. 4). If the MRI apparatus 11 is not provided with the imaging system power supply switch 29, the power control function 313 turns off power of components (the couch 17, the sequence control system 19, and the computer system 27) included in the imaging system 16, upon receipt of the first power outage signal. Through the process in this step, the target of power supply from the UPS 5 at the time of power outage of the commercial power supply 3 is limited to only the cooling portion 150 and the power control circuitry 31.

(Step S204)

The power generator 9 activates the motor upon receipt of the second power outage signal. By the activation of the motor, the power generator 9 starts generating power. In a period from the time of activation of the motor to the predetermined time, the power generated by the power generator 9 becomes stable. Thus, after the execution of this step, the activation of the power generator 9 is completed (step S204-1 in FIG. 4).

(Step S205)

The switch board 7 switches the power supply line from the commercial power supply 3 to the power generator 9 after the predetermined time has elapsed since the power outage of the commercial power supply 3 occurred. Specifically, after counting the predetermined time, the timer outputs a power supply switch signal to the power supply switch. The power supply switch switches a power supply source of the MRI apparatus 11 from the commercial power supply 3 to the power generator 9. Accordingly, the power generated by the power generator 9 is supplied to the UPS 5 and the MRI apparatus 11.

(Step S206)

The UPS 5 detects current conduction on the primary side of the UPS 5, and outputs a current conduction signal to the power control circuitry 31. Specifically, the UPS 5 detects current conduction on the primary side by the current conduction detector. By the detection of the current conduction, the current conduction detector generates a current conduction signal. The current conduction signal is electrically transmitted as an electrical signal from the UPS 5 to the power control circuitry 31. The current conduction signal may be converted to an optical signal (for example, digital data corresponding to "1") before being input to the MRI apparatus 11, and the converted optical signal may be transmitted to the power control circuitry 31 via, for example, an optical cable.

(Step S207)

The power generator 9 detects feeding from the power generator 9 to the switch board 7 by the feed detector, and outputs a feeding signal to the power control circuitry 31. Specifically, the feed detector in the power generator 9 detects the feeding by the feed relay provided on the secondary side of the power generator 9. The feeding is based on the power generated by the power generator 9. By detecting the feeding, the feed detector generates a feeding signal. The feeding signal is electrically transmitted as an electrical signal from the power generator 9 to the power control circuitry 31 via the switch board 7. The feeding signal may be converted to an optical signal (for example, digital data corresponding to "1") before being input to the MRI apparatus 11, and the converted optical signal may be transmitted to the power control circuitry 31 via, for example, an optical cable.

(Step S208)

The power control circuitry 31 acquires the current conduction signal from the UPS 5, and acquires the feeding signal from the power generator 9. By the determination function 311, the power control circuitry 31 determines that power outage has occurred in the commercial power supply 3 based on the current conduction signal and the feeding signal (power outage determination). The determination by the determination function 311 may be performed a plurality of times after the power outage has occurred in the commercial power supply 3, and the time interval of execution of the determination may be set to a discretionary interval, for example, every minute.

(Step S209)

If power recovery in the commercial power supply 3 is not detected by the power outage detector in the switch board 7 (No in step S209), the process in step S210 is performed. If power recovery of the commercial power supply 3 is detected by the power outage detector in the switch board 7 (Yes in step S209), the process in step S211 is performed.

(Step S210)

The power control circuitry 31 controls the imaging system power supply switch 29 to maintain the imaging system power supply switch 29 to be opened. Specifically, the power control circuitry 31 maintains the imaging system power supply switch 29 to be opened by maintaining supply of current to the contact driving coil in the imaging system power supply switch 29. If the MRI apparatus 11 is not provided with the imaging system power supply switch 29, the power control function 313 maintains the power of components (the couch 17, the sequence control system 18, and the computer system 27) included in the imaging system 16 in the OFF state.

(Step S211)

The switch board 7 detects power recovery of the commercial power supply 3. Specifically, the power outage detector in the switch board 7 generates a power recovery signal upon recovery of the commercial power supply 3. The switch board 7 outputs the generated power recovery signal to the power generator 9.

(Step S212)

The power generator 9 performs a shutdown operation of the motor upon receipt (detection) of the power recovery signal. Upon completion of the shutdown operation, the process of step S213 is performed. Specifically, upon starting of the shutdown operation of the motor, the UPS 5 starts supplying power to the MRI apparatus 11. At this time, since the imaging system power supply switch 29 is opened, the power from the UPS 5 is supplied to the power control circuitry 31 and the cooling portion 150.

(Step S213)

When the shutdown operation of the motor is completed, the power generator 9 outputs the completion signal to the switch board 7. Upon receipt of the completion signal, the switch board 7 switches the power supply line from the power generator side to the commercial power supply side. Specifically, the power supply switch in the switch board 7 switches the power supply source of the MRI apparatus 11 from the power generator 9 to the commercial power supply 3 upon receipt of the completion signal. At this time, since the imaging system power supply switch 29 is opened, the power from the commercial power supply 3 is supplied to the power control circuitry 31 and the cooling portion 150.

In other words, during a period when the processes of step S212 to step S213 are performed, namely, during a period when the shutdown operation of the motor is performed (hereinafter referred to as the shutdown operation period), power is supplied from the UPS 5 to the MRI apparatus 11. The shutdown operation period is, for example, about one minute.

(Step S214)

The UPS 5 detects current conduction on the primary side of the UPS 5, and outputs a current conduction signal to the power control circuitry 31. Since this step is similar to step S206, explanations thereof are omitted.

(Step S215)

Upon output of the completion signal to the switch board 7, the power generator 9 stops transmission of the feeding signal to the power control circuitry 31. Instead of stopping the feeding signal, the power generator 9 may transmit an optical signal, for example, digital data corresponding to "0", to the power control circuitry 31 via, for example, an optical cable.

(Step S216)

The power control circuitry 31 receives a current conduction signal from the UPS 5, but does not receive a feeding signal from the power generator 9. The power control circuitry 31 determines that the commercial power supply 3 has recovered based on the current conduction signal and the stoppage of the feeding signal by the determination function 311 (the power recovery determination). When the fuel for use in the motor of the power generator 9 has been exhausted, namely, when the power warranty period of the power generator has expired, the determination function 311 executes the power recovery determination and thereafter proceeds to the subsequent processes.

(Step S217)

The power control circuitry 31 stops supplying a current to the contact driving coil in the imaging system power supply switch 29 by the power control function 313 upon detection of the power recovery determination. Accordingly, the imaging system power supply switch 29 is closed, and the power is supplied to the overall MRI apparatus 11. Through the above steps, the power supply processing is ended.

FIG. 6 is a table showing determination results by the determination function 311 in relation to a state of feeding to the MRI apparatus 11 in the power supply processing. As shown in FIG. 6, when a power outage signal is output from the UPS 5 and a feeding signal is not supplied from the power generator 9, the determination function 311 gives power outage determination as the state of feeding. When a current conduction signal is output from the UPS 5 and a feeding signal is transmitted from the power generator 9, the determination function 311 gives power outage determination as the state of feeding. When a current conduction signal is output from the UPS 5 and a feeding signal is not transmitted from the power generator 9, the determination function 311 gives power recovery determination as the state of feeding. Thus, the determination function 311 sets the power recovery determination when the sum of the output signal from the UPS 5 and the output signal from the power generator 9 is equal to 1, and sets the power outage determination when the sum of the output signal from the UPS 5 and the output signal from the power generator 9 is not equal to 1.

Figure 7:
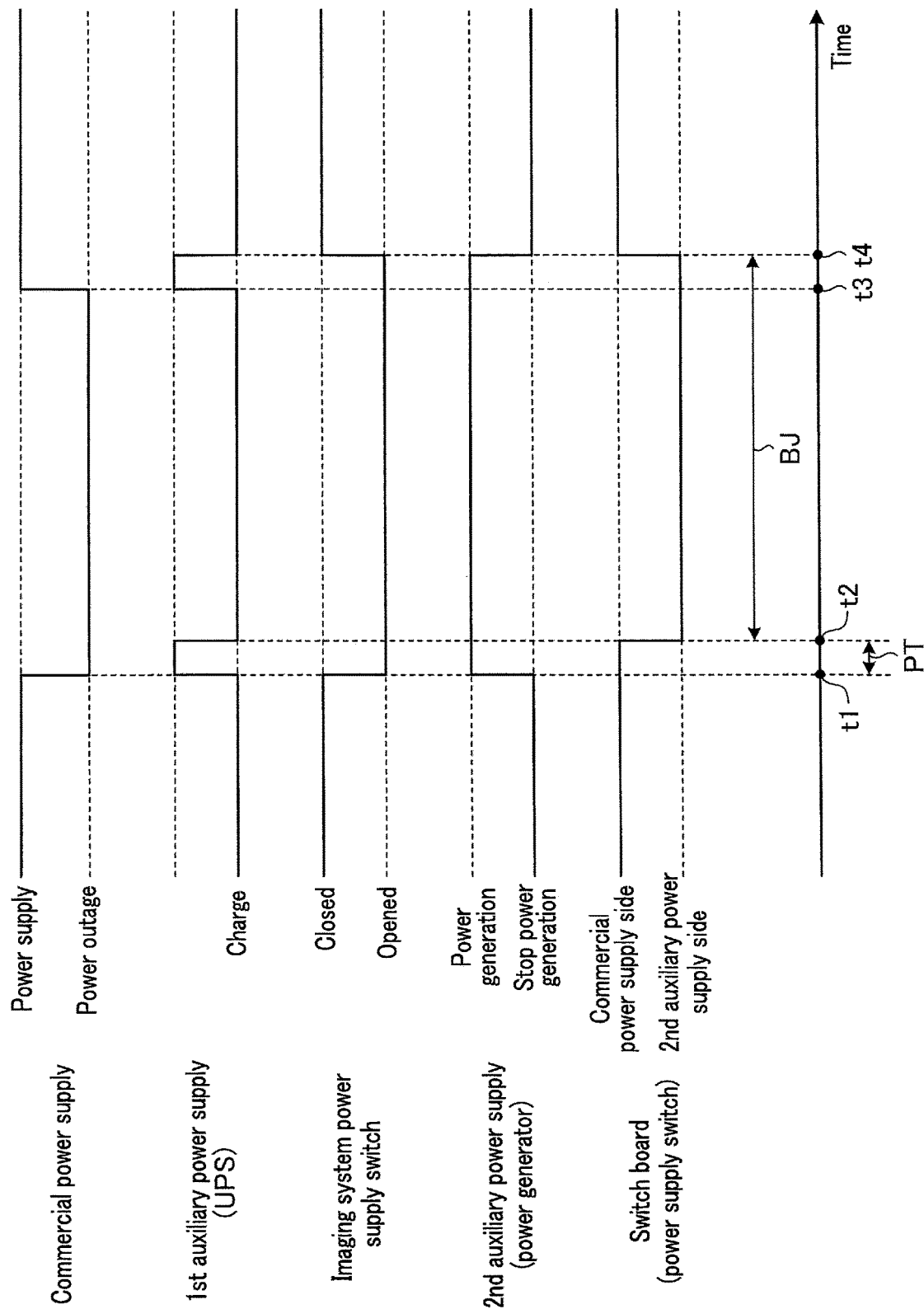
FIG. 7 is a diagram showing an example of an operation timing of each unit related to the power supply processing according to the embodiment.

FIG. 7 is a diagram showing an example of an operation timing of each unit related to the power supply processing. Time t1 in FIG. 7 indicates a time at which power outage of the commercial power supply 3 occurred (power outage occurrence time). At this time, the UPS 5 supplies power to the MRI apparatus 11. Namely, at time Ti, the imaging system power supply switch 29 is opened by the first power outage signal, and power is supplied from the UPS 5 to the cooling portion 150 and the power control circuitry 31. In addition, upon receipt of the second power outage signal, the motor in the power generator 9 starts activation. Furthermore, upon receipt of the second power outage signal, the timer starts counting the time.

Time t2 in FIG. 7 indicates a time when a predetermined period of time PT has elapsed since the power outage occurrence time t1. As shown in FIG. 7, in a period from time t1 to time t2, the power from the UPS 5 is supplied to the cooling portion 150 and the power control circuitry 31. At time t2, the activation of the power generator 9 is completed and power is generated stably. At this time, the power supply line is switched from the commercial power supply 3 to the power generator 9. Time t3 indicates a time when the commercial power supply 3 recovers. Period BJ shown in FIG. 7 corresponds to a period in which the process of step S208 is repeated by the determination function 311. At time t3, the shutdown operation of the power generator 9 is started. Time t4 indicates a time when the shutdown operation of the power generator 9 is completed. A period from time t3 to time t4 corresponds to the shutdown operation period. As shown in FIG. 7, during the shutdown operation period (from time t3 to time t4), the power from the UPS 5 is supplied to the cooling portion 150 and the power control circuitry 31. At time t4, the power generation by the power generator 9 stops, and the power supply switch in the switch board 7 switches the power supply line from the power generator 9 to the commercial power supply 3. In addition, the imaging system power supply switch 29 is closed.

The MRI system 1 according to the embodiment described above determines a state of feeding to the MRI apparatus 11 based on an output from the first auxiliary power supply 5 configured to supply power to the MRI apparatus 11 at a time of power outage of the commercial power supply 3 electrically connected to the MRI apparatus 11 and an output from one or more second auxiliary power supplies 9 electrically connected in series to the first auxiliary power supply 5 and configured to supply power to the MRI apparatus 11, and based on the determination result of the state of feeding, the MRI system 1 performs control of power consumption in the MRI apparatus 11.

Specifically, according to the MRI system 1, at a time of power outage of the commercial power supply 3, power is supplied from the first auxiliary power supply 5 or the second auxiliary power supply 9 to the power control circuitry 31 related to determination of the state of feeding and control of the power consumption and to the cooling portion 150 configured to cool the superconducting coil 152 for generating a magnetostatic field. Furthermore, the first auxiliary power supply 5 in the MRI system 1 is, for example, a UPS, and in case of power outage of the commercial power supply 3, electrically connected to the cooling portion 150 including the refrigerator 153 to cool the refrigerant in relation to cooling of the superconducting coil 152 and a heat exchanger in relation to cooling of the refrigerator 153. In case of non-power-outage of the commercial power supply 3, the first auxiliary power supply 5 is electrically connected to the commercial power supply 3 and charged by power supplied from the commercial power supply 3.

In more detail, the MRI system 1 according to the embodiment is provided in a middle portion of an electrical path between the commercial power supply 3 and the MRI apparatus 11, and at a timing when a predetermined time has elapsed since the occurrence of power outage of the commercial power supply 3, the power supply source of the MRI apparatus 11 is switched from the commercial power supply 3 to the UPS 5 or the second auxiliary power supply 9 which is realized by the power generator. More specifically, when power outage of the commercial power supply 3 occurs, the first auxiliary power supply 5 of the MRI system 1 outputs the first power outage signal relating to power outage of the commercial power supply 3 to the power control circuitry 31 including the determination function 311 and the power control function 313. When the commercial power supply 3 is not in the power outage or the power supply source to the MRI apparatus 11 has been switched from the commercial power supply 3 to the second auxiliary power supply 9, the first auxiliary power supply 5 outputs the current conduction signal to the determination portion of the power control circuitry 31.

In addition, when the power supply source to the MRI apparatus 11 has been switched from the commercial power supply 3 to the second auxiliary power supply 9, the second auxiliary power supply 9 in the MRI system 1 according to the embodiment outputs the feeding signal to the power control circuitry 31 via the switch board 7. Furthermore, the power control circuitry 31 determines whether power outage of the commercial power supply 3 has occurred by the determination function 311 based on the first power outage signal or the current conduction signal, and a presence or absence of the feeding signal, and then, if the first power outage signal is received and if the determination function 311 determines that power outage has occurred, power is supplied to the cooling portion 150 and the power control circuitry 31 by the power control function 313.

As has been described above, according to the MRI system 1 of the embodiment, even if power is supplied to the MRI apparatus 11 from the second auxiliary power supply 9 via the first auxiliary power supply 5 (hereinafter referred to as power supply from auxiliary power supply), the determination function 311 determines that the power outage of the commercial power supply 3 continues. Therefore, according to the MRI system 1 of the embodiment, during the period BJ in which power supply from auxiliary power supply is being performed, the imaging system power supply switch 29 is maintained to be opened. Thus, it is ensured that the minimum necessary unit, namely, the cooling portion 150 and the power control circuitry 31, are power-fed, whereas the imaging system 16 is not. Based on the above, the MRI system 1 can avoid the problem wherein the power compensation time by the second auxiliary power supply 9, such as the power generator, will be considerably shorter than the preset period of time. Thus, power compensation by the second auxiliary power supply 9 can be performed for the preset time when the power outage of the commercial power supply 3 has occurred.

(First Modification)

Figure 8:
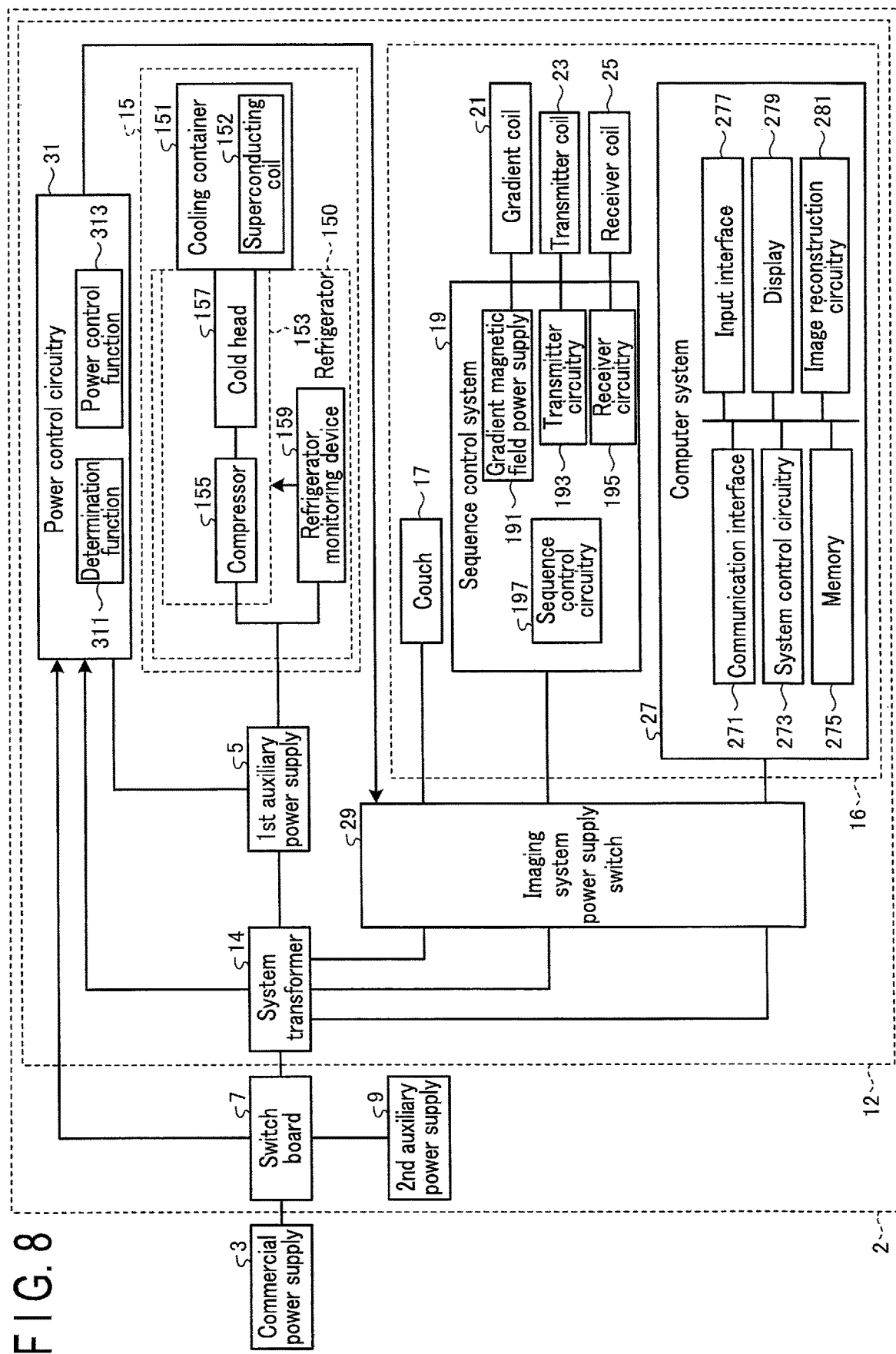
FIG. 8 is a block diagram showing an example of a magnetic resonance imaging system according to a first modification of the embodiment.

In the first modification, the first auxiliary power supply 5 realized by a UPS is disposed between the system transformer on one hand and the cooling portion 150 and the power control circuitry 31 on the other in the MRI apparatus. FIG. 8 is a diagram showing an example of a configuration of an MRI system 2 according to the modification. As shown in FIG. 8, the first auxiliary power supply 5 is disposed on a stage subsequent to the system transformer 14 and in front of the cooling portion 150 and the power control circuitry 31 in respect of power supply. As an output line from the switch board 7 to the power control circuitry 31, an optical cable for transmission of optical signals is used. Furthermore, as shown in FIG. 8, the system transformer 14 is provided in the frontmost stage of power supply to an MRI apparatus 12. Thus, the MRI system 2 in the present modification can cut off the leak current relating to the MRI apparatus 12. The power supply processing and effects in the present modification are the same as those in the embodiment described above, and descriptions thereof will be omitted.

(Second Modification)

Figure 9:
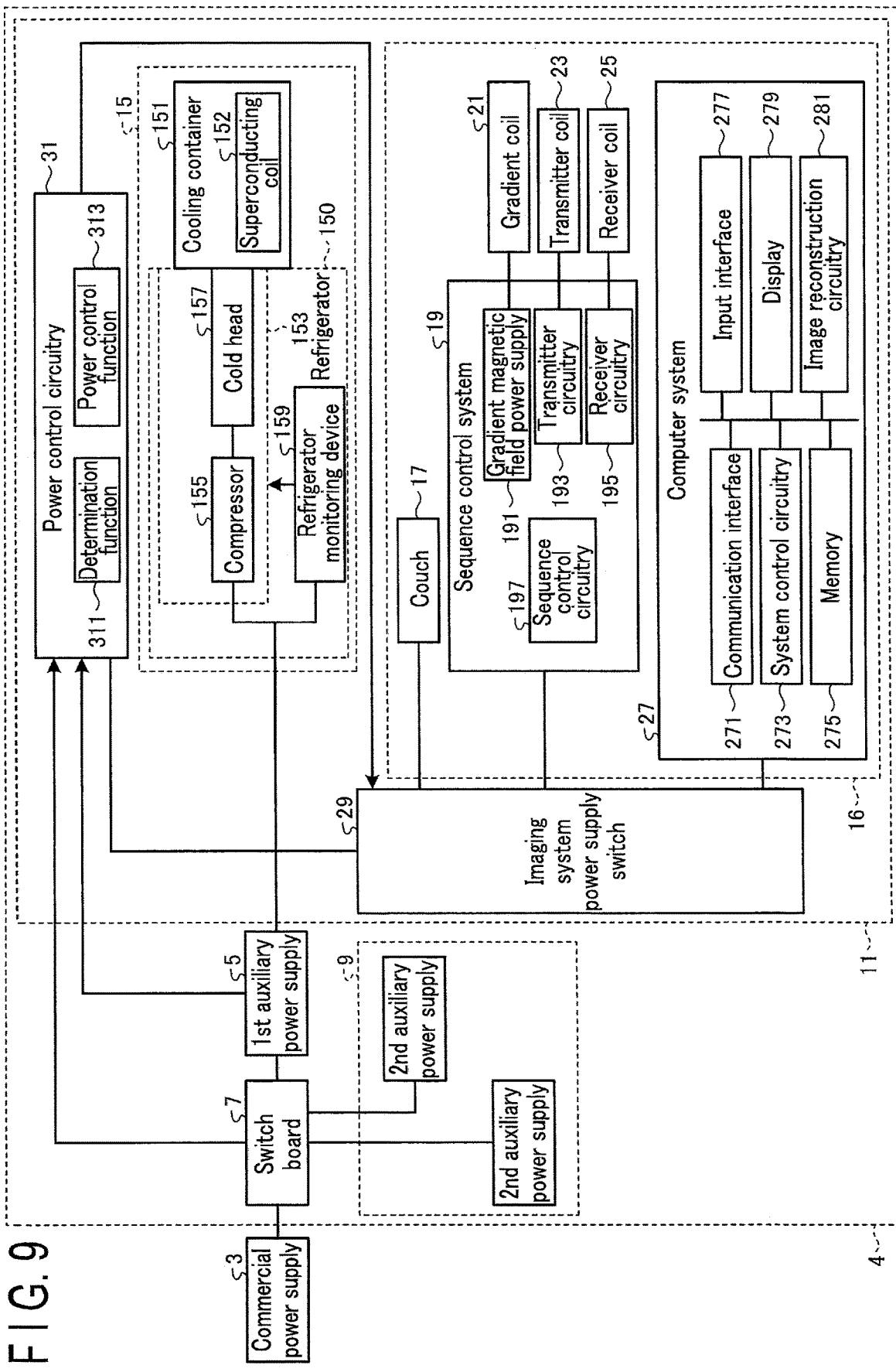
FIG. 9 is a block diagram showing an example of a magnetic resonance imaging system according to a second modification of the embodiment.
Figure 10:
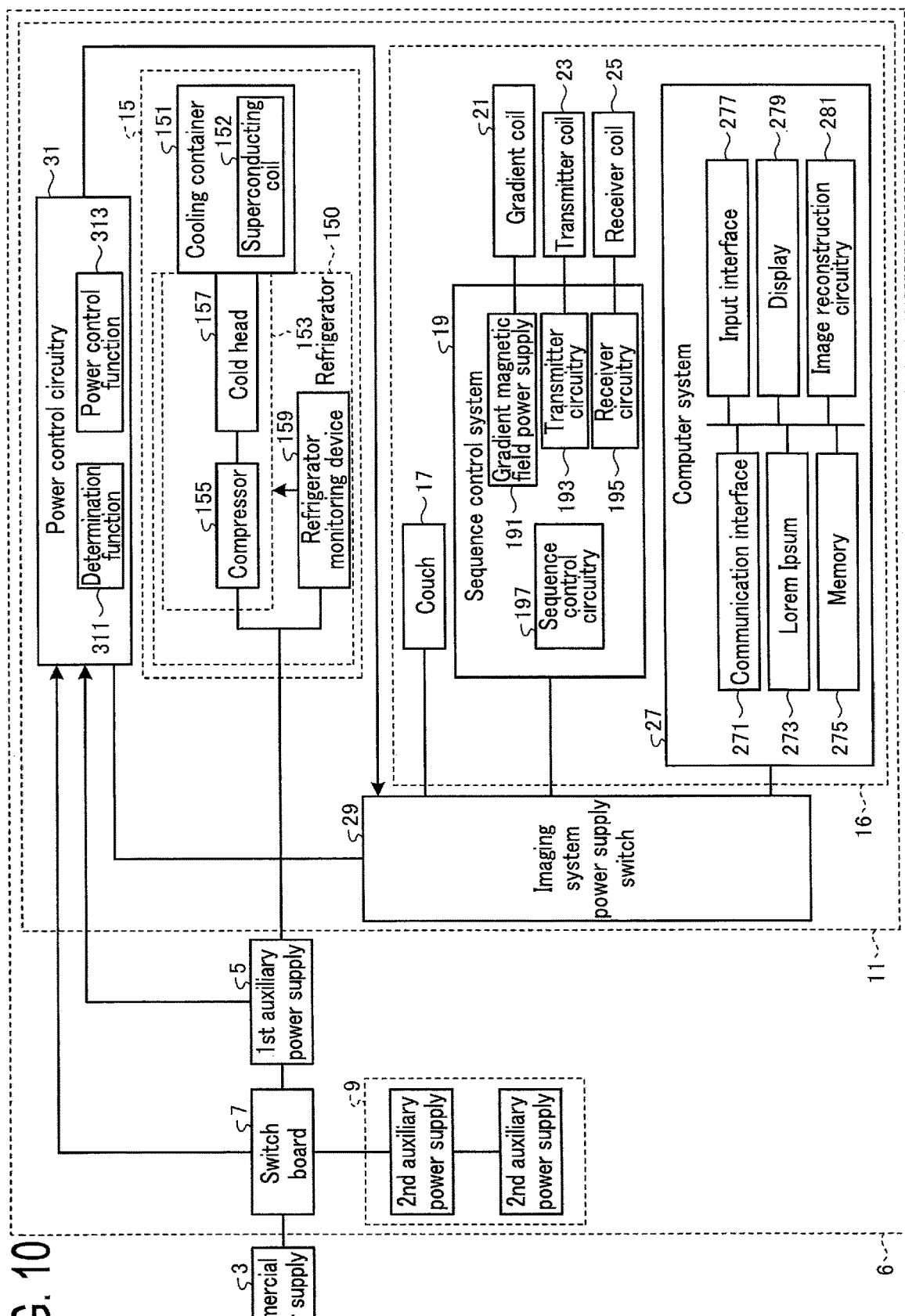
FIG. 10 is a block diagram showing an example of a magnetic resonance imaging system according to a second modification of the embodiment.

This modification relates to an MRI system having three auxiliary power supplies (a first auxiliary power supply and two second auxiliary power supplies). Each of the two second auxiliary power supplies is electrically connected to the first auxiliary power supply 5 in series. The two second auxiliary power supplies 9 may be electrically connected in parallel as in an MRI system 4 shown in FIG. 9, or may be electrically connected in series as in an MRI system 6 shown in FIG. 10. As shown in FIGS. 9 and 10, one or more second auxiliary power supplies are electrically connected to the first auxiliary power supply 5 in series, and supplies power to the MRI apparatus 11. The power control circuitry 31 determines a state of feeding from the first auxiliary power supply 5 and the one or more second auxiliary power supplies to the MRI apparatus 11 through the determination function 311. The power supply processing and effects in the present modification are the same as those in the embodiment described above, and descriptions thereof will be omitted.

When the technical idea of the embodiment is realized by a power control method, the power control method determines a state of feeding to the MRI apparatus 11 based on an output from the first auxiliary power supply 5 configured to supply power to the MRI apparatus 11 at a time of power outage of the commercial power supply 3 electrically connected to the MRI apparatus 11 and an output from one or more second auxiliary power supply 9 electrically connected in series to the first auxiliary power supply 5, and based on the determination result of the state of feeding, the method performs control of power consumption in the MRI apparatus 11. The procedures and effects of the power supply processing executed by the power control method are the same as those in the embodiment described above, and descriptions thereof will be omitted.

When the technical idea of the embodiment is realized by a power control program, the power control program causes a computer to determine a state of feeding to the MRI apparatus 11 based on an output from the first auxiliary power supply 5 configured to supply power to the MRI apparatus 11 at a time of power outage of the commercial power supply 3 electrically connected to the MRI apparatus 11 and an output from one or more second auxiliary power supplies 9 electrically connected in series to the first auxiliary power supply 5, and based on the determination result of the state of feeding, to perform control of power consumption in the MRI apparatus 11.

The power supply processing may also be implemented by installing power control programs in a computer in various modalities including the MRI apparatus 11, and developing them in the memory. The program that causes the computer to execute the processing can be stored and distributed by means of a storage medium, such as a magnetic disk (a hard disk, etc.), an optical disk (CD-ROM, DVD, etc.), and a semiconductor memory. The procedures and effects of the power supply processing executed by the power control program are the same as those in the embodiment described above, and descriptions thereof will be omitted.

The embodiment or the like described above allows power compensation by an auxiliary power supply for a preset period of time, when power outage has occurred.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging system comprising:
a magnetic resonance imaging apparatus including an imaging system and a magnetostatic field generation unit;
a first auxiliary power supply configured to supply power to the magnetic resonance imaging apparatus at a time of power outage of a commercial power supply electrically connected to the magnetic resonance imaging apparatus;
one or more second auxiliary power supplies each configured to supply the power to the magnetic resonance imaging apparatus, the one or more second auxiliary power supplies being electrically connected in series to the first auxiliary power supply; and
control circuitry configured to:
 determine a state of feeding from the first auxiliary power supply and the one or more second auxiliary power supplies to the magnetic resonance imaging apparatus; and
 perform control of power consumption in the magnetic resonance imaging apparatus based on a determination result of the state of feeding, wherein
the control circuitry determines whether or not power outage of the commercial power supply has occurred based on a power outage signal and a current conduction signal from the first auxiliary power supply, and a feeding signal from the second auxiliary power supply,
the imaging system of the magnetic resonance imaging apparatus is not power-fed when the power outage occurs.

2. The magnetic resonance imaging system according to claim 1, further comprising a cooling portion configured to cool a superconducting coil for generating a magnetostatic field, wherein
at the time of power outage of the commercial power supply, the control circuitry controls the power from the first auxiliary power supply or the one or more second auxiliary power supplies to the cooling portion and the control circuitry.

3. The magnetic resonance imaging system according to claim 2, wherein at the time of power outage of the commercial power supply, the first auxiliary power supply is electrically connected to the cooling portion.

4. The magnetic resonance imaging system according to claim 2, wherein the cooling portion includes a refrigerator configured to cool a refrigerant for cooling the superconducting coil and a heat exchanger for cooling the refrigerator.

5. The magnetic resonance imaging system according to claim 1, wherein the first auxiliary power supply is an uninterruptible power supply.

6. The magnetic resonance imaging system according to claim 1, wherein each of the one or more auxiliary power supplies is an uninterruptible power supply or a power generator.

7. The magnetic resonance imaging system according to claim 1, wherein at a time of non-power-outage of the commercial power supply, the first auxiliary power supply is electrically connected to the commercial power supply and substantially power-fed by the commercial power supply.

8. The magnetic resonance imaging system according to claim 1, further comprising a switch board provided in a middle portion of an electrical path between the commercial power supply and the magnetic resonance imaging apparatus, and configured to, at a timing when a predetermined time has elapsed since the occurrence of power outage of the commercial power supply, switch a power supply source of the magnetic resonance imaging apparatus from the commercial power supply to the one or more second auxiliary power supplies, wherein
the first auxiliary power supply is configured to:
 at the time of occurrence of the power outage, output a power outage signal relating to the power outage to the control circuitry; and
 at the time of non-power-outage of the commercial power supply and when the power supply source has been switched from the commercial power supply to the one or more second auxiliary power supplies, output a current conduction signal to the control circuitry,
the one or more second auxiliary power supplies are configured to, when the power supply source has been switched from the commercial power supply to the one or more second auxiliary power supplies, output a feeding signal indicating that power is supplied from the one or more second auxiliary power supplies to the magnetic resonance imaging apparatus, via the switch board to the control circuitry,
the control circuitry determines whether power outage of the commercial power supply has occurred based on the power outage signal or the current conduction signal, and a presence or absence of the feeding signal, and
when receiving the power outage signal and when the control circuitry determines that the power outage has occurred, the control circuitry supplies the power to a cooling portion configured to cool a superconducting coil for generating a magnetostatic field and the control circuitry.

9. A power control method comprising:
determining a state of feeding to a magnetic resonance imaging apparatus including an imaging system and a magnetostatic field generation unit from a first auxiliary power supply configured to supply power to the magnetic resonance imaging apparatus at a time of power outage of a commercial power supply electrically connected to the magnetic resonance imaging apparatus, and one or more second auxiliary power supplies each electrically connected in series to the first auxiliary power supply and configured to supply the power to the magnetic resonance imaging apparatus;
performing control of power consumption in the magnetic resonance imaging apparatus based on a result of determining the state of feeding; and
determining whether or not a power outage of the commercial power supply has occurred based on a power outage signal and a current conduction signal from the first auxiliary power supply, and a feeding signal from the second auxiliary power supply, wherein the imaging system of the magnetic resonance imaging apparatus is not power-fed when the power outage occurs.

\* \* \* \* \*